(12) United States Patent
Muehlfeit et al.

(10) Patent No.: US 12,076,974 B2
(45) Date of Patent: Sep. 3, 2024

(54) METHOD FOR IDENTIFYING A RELIEF PRECURSOR FOR PRODUCING A RELIEF STRUCTURE

(71) Applicant: Flint Group Germany GmbH, Stuttgart (DE)

(72) Inventors: Markus Muehlfeit, Weil der Stadt (DE); Timo Bickert, Barnitz (DE); Ruediger Lennick, Remseck (DE); Andrew Knapp, Charlotte, NC (US)

(73) Assignee: Flint Group Germany GmbH, Stuttgart (DE)

( * ) Notice: Subject to any disclaimer, the term of this patent is extended or adjusted under 35 U.S.C. 154(b) by 0 days.

(21) Appl. No.: 16/768,682

(22) PCT Filed: Dec. 7, 2018

(86) PCT No.: PCT/EP2018/083996
§ 371 (c)(1),
(2) Date: May 31, 2020

(87) PCT Pub. No.: WO2019/110809
PCT Pub. Date: Jun. 13, 2019

(65) Prior Publication Data
US 2021/0187934 A1    Jun. 24, 2021

(30) Foreign Application Priority Data
Dec. 8, 2017 (EP) .................................... 17206168

(51) Int. Cl.
G03F 7/20 (2006.01)
B41C 1/05 (2006.01)

(52) U.S. Cl.
CPC .............. B41C 1/05 (2013.01); G03F 7/2022 (2013.01)

(58) Field of Classification Search
None
See application file for complete search history.

(56) References Cited

U.S. PATENT DOCUMENTS

| | | |
|---|---|---|
| 3,418,118 A | 12/1968 | Thommes et al. |
| 3,567,453 A | 3/1971 | Borden |
| 3,615,629 A | 10/1971 | Wilhelm |
| 4,343,891 A | 8/1982 | Aasen et al. |
| 4,590,287 A | 5/1986 | Riediker et al. |
| 4,713,401 A | 12/1987 | Riediker et al. |
| 4,743,528 A | 5/1988 | Farid et al. |
| 4,743,529 A | 5/1988 | Farid et al. |
| 4,743,530 A | 5/1988 | Farid et al. |
| 4,743,531 A | 5/1988 | Farid et al. |
| 4,857,654 A | 8/1989 | Riediker et al. |
| 5,026,625 A | 6/1991 | Riediker et al. |
| 6,916,596 B2 | 7/2005 | Yang et al. |
| 8,114,566 B2 | 2/2012 | Araki et al. |
| 8,808,968 B2 | 8/2014 | Choi et al. |
| 9,375,916 B2 | 6/2016 | Thomas et al. |
| 2003/0219659 A1* | 11/2003 | Manness ............... G03F 7/38 430/311 |
| 2006/0008729 A1* | 1/2006 | Ichikawa ............. G03F 7/202 430/270.1 |
| 2008/0149820 A1 | 6/2008 | Jordan et al. |
| 2008/0158527 A1 | 7/2008 | Manness |
| 2011/0189600 A1* | 8/2011 | Plumer ............... B41C 1/1083 430/30 |
| 2012/0022680 A1 | 1/2012 | Tanida et al. |
| 2012/0196229 A1 | 8/2012 | Sanger |
| 2014/0087306 A1 | 3/2014 | Blomquist et al. |
| 2016/0054656 A1 | 2/2016 | Bonney |
| 2016/0154308 A1 | 6/2016 | Fronczkiewicz et al. |

FOREIGN PATENT DOCUMENTS

| | | |
|---|---|---|
| CN | 103338938 A | 10/2013 |
| CN | 103692764 A | 4/2014 |
| CN | 105531628 A | 4/2016 |
| DE | 1522444 A1 | 7/1969 |
| DE | 102009015327 A1 | 9/2010 |
| EA | 011682 B1 | 4/2009 |
| EP | 0059988 A1 | 9/1982 |
| EP | 0079514 A2 | 5/1983 |
| EP | 0085472 A1 | 8/1983 |
| EP | 0109772 A2 | 5/1984 |
| EP | 0109773 A2 | 5/1984 |
| EP | 0224164 A2 | 6/1987 |
| EP | 0332070 A2 | 9/1989 |
| EP | 0816920 A2 | 1/1998 |

(Continued)

OTHER PUBLICATIONS

Flint, Third party observation in PCT/EP2018/083996, Apr. 6, 2020, 1-3.

(Continued)

*Primary Examiner* — Joshua D Zimmerman
(74) *Attorney, Agent, or Firm* — Faegre Drinker Biddle & Reath LLP

(57) ABSTRACT

A method for identifying a relief precursor or a relief comprising a carrier and a relief-forming layer, having the steps:
a) providing a relief precursor comprising a carrier and a relief-forming layer;
b) providing data which identifies the type of relief precursor and, if appropriate, contains process-relevant data for processing it, in the form of at least one two-dimensional code;
c) introducing the at least one two-dimensional code into the relief-forming layer as a relief.

17 Claims, No Drawings

(56) References Cited

FOREIGN PATENT DOCUMENTS

| | | |
|---|---|---|
| EP | 0992846 A1 | 4/2000 |
| EP | 1195645 A1 | 4/2002 |
| EP | 1679549 A2 | 7/2006 |
| EP | 1735664 A1 | 12/2006 |
| EP | 2313270 A1 | 4/2011 |
| EP | 2722713 A2 | 4/2014 |
| EP | 2987030 A1 | 2/2016 |
| EP | 3139210 A1 | 3/2017 |
| JP | 45-037377 | 11/1970 |
| JP | 46-042363 B1 | 12/1971 |
| JP | 59-152396 A | 8/1984 |
| JP | 59-174831 A | 10/1984 |
| JP | 61-151197 A | 7/1986 |
| JP | 62-006223 A | 1/1987 |
| JP | 63-014340 A | 1/1988 |
| JP | 63-041484 A | 2/1988 |
| JP | 63-138345 A | 6/1988 |
| JP | 63-142345 A | 6/1988 |
| JP | 63-142346 A | 6/1988 |
| JP | 63-143537 A | 6/1988 |
| JP | 01-152109 A | 6/1989 |
| JP | 01-304453 A | 12/1989 |
| JP | 02-000249 A | 1/1990 |
| JP | 02-004705 A | 1/1990 |
| JP | 11-119204 A | 4/1999 |
| JP | 11-133590 A | 5/1999 |
| JP | 2000181051 A * | 6/2000 |
| JP | 2004-038144 A | 2/2004 |
| JP | 2009-297981 A | 12/2009 |
| JP | 4486516 B2 | 6/2010 |
| JP | 4875475 B2 * | 2/2012 |
| JP | 2014-069575 A | 4/2014 |
| JP | 2016-526708 A | 9/2016 |
| WO | 03/62900 A1 | 7/2003 |
| WO | 2004/015491 A1 | 2/2004 |
| WO | 2005/101130 A1 | 10/2005 |
| WO | 2006/087351 A2 | 8/2006 |
| WO | 2010/014156 A1 | 2/2010 |
| WO | 2014/172136 A1 | 10/2014 |
| WO | 2015/007667 A1 | 1/2015 |

OTHER PUBLICATIONS

International Search Report and Written Opinion received for PCT Patent Application No. PCT/EP2018/083996, mailed on Apr. 2, 2019, 18 pages (8 pages of English Translation and 10 pages of Original Document).

* cited by examiner

METHOD FOR IDENTIFYING A RELIEF PRECURSOR FOR PRODUCING A RELIEF STRUCTURE

CROSS-REFERENCE TO RELATED APPLICATIONS

This application is a national stage application (under 35 U.S.C. § 371) of PCT/EP2018/083996, filed Dec. 7, 2018, which claims benefit of European Application No. 17206168.1, filed Dec. 8, 2017, both of which are incorporated herein by reference in their entirety.

The invention relates to a method for identifying a relief precursor, in particular a printing plate precursor, a method for producing a relief, in particular a printing plate, starting from the relief precursor, and the relief and use thereof.

Relief precursors generally comprise a carrier layer and a light-sensitive layer and further layers. As a rule, the relief is produced in that the light-sensitive layer is changed by exposure such that, in a following step, the unexposed regions can be removed. Relief precursors are offered and used in a multiplicity of variants; they can, for example, differ in the layer thickness, the reactivity, the number and type of layers, the hardness and further properties. This makes the processing of the relief precursors susceptible to mix-ups and erroneous productions if they are processed with the wrong process parameters or the wrong data is used.

In order to counteract mix-ups, various precursor types are colored differently. For example, EP 1 679 549 B1 describes the use of luminescent dyes for this purpose. However, this color code does not include any further information about the properties of the relief precursors.

Another possibility is the application of identifiers on or between the individual layers of the relief precursors. Inscriptions with inks or labels have proven to be non-practicable, since these do not withstand undamaged the process steps for producing the relief structures. JP-H 11133590 describes the application of a marking to a protective film on the upper side of the relief precursor. Since this film is generally removed before the processing, the information is no longer available during the processing.

EP 2 722 713 A2 describes the introduction of a code between the carrier film and the light-sensitive layer of the relief precursor. Said code is also maintained in the following process steps, but it is complicated to produce this layer and to ensure that the code does not influence the other process steps and nevertheless is easily legible. In relief precursors in which a mask layer is integrated, the code cannot be read because of the high absorption of the mask layer.

In U.S. Pat. No. 9,375,916 it is proposed to apply a marking to the rear side of the carrier layer or in the depressions of the relief, in order by using the same to ensure alignment (registration) in the following steps. Here, however, the marking is applied only after the production of the relief and therefore cannot prevent process errors during the relief production.

JP2000181051 describes, therefore likewise proposes, applying a marking in the depressions of the relief in order to be able to identify the relief structure following repeated use and during storage. However, this requires the production of an additional mask and an additional exposure step, which makes the method complicated and lengthy.

It is therefore an object of the invention to provide a method for the permanent identification of a relief precursor which does not have the disadvantages described and which permits permanent coding of data, the reading and use of the same for process control.

The object is achieved by a method for identifying a relief precursor or a relief comprising a carrier and a relief-forming layer, having the steps:
  a) providing a relief precursor comprising a carrier and a relief-forming layer;
  b) providing data which identifies the type of relief precursor or relief and, if appropriate, process parameters for processing the same, in the form of at least one two-dimensional code;
  c) introducing the two-dimensional code into the relief-forming layer as a relief.

According to the invention, a two-dimensional code is produced during the image-based structuring of the relief precursor and is then maintained as a three-dimensional relief. By reading the data encoded in two- or three-dimensional form and data transmission, the production process can be controlled. The code can be read by machine, preferably without contact.

In step a) a relief precursor is provided which comprises a dimensionally-stable carrier and a relief-forming layer. Dimensionally-stable carrier materials, which can optionally have further layers, can be used as carriers. Examples of suitable dimensionally-stable carriers are plates, films and conical and cylindrical tubes (sleeves) made of metals such as steel, aluminum, copper or nickel or plastics such as polyethylene terephthalate, polybutylene terephthalate, polyamide and polycarbonate, fabrics and nonwovens such as glass fiber fabrics, and composite materials made of glass fibers and plastics. Suitable dimensionally-stable carriers are in particular dimensionally-stable carrier films or metal sheets, for example polyethylene or polyester films, steel or aluminum plates. These carrier films or sheets are generally 50 to 1100 µm, preferably 75 to 400 µm, for example about 250 µm, thick. If a plastic film is used, its thickness generally lies in the range from 100 to 200 µm, preferably from 125 to 175 µm. If steel is used as a carrier material, steel sheets having a thickness of 0.05 to 0.3 mm are preferred. For protection against corrosion, tinned steel sheets are preferably used. These carrier films or carrier sheets can be coated with a thin adhesion-promoting layer, for example a 0.05 to 5 µm thick layer, on the side of the carrier film that faces the substrate layer.

Additional adhesion-improving intermediate layers can be located on the side of the adhesive layer that faces away from the carrier layer, have layer thickness between 0.1 and 50 µm, in particular 1 and 10 µm.

The relief precursor comprises at least one relief-forming layer. The relief-forming layer can be applied directly to the carrier. However, there can also be other layers located between the carrier and the relief-forming layer, such as adhesive layers or elastic or compressible underlayers The relief forming layer can also comprise more than one layer, generally comprising 2 to 20 layers, preferably 2 to 5 layers, particularly preferably 2 to 3 layers, very particularly preferably one layer. The layers can contain the same constituents or different constituents and these in the same or different proportions. Preferably, said layers contain the same constituents. Preferably, the relief-forming layers which are closest to the carrier layer are already fixed, cross-linked and/or reacted. At least one relief-forming layer, which can still be fixed, cross-linked or reacted, is arranged on said fixed, cross-linked or reacted layers.

The thickness of the relief-forming layer is generally 0.1 mm to 7 mm, preferably 0.5 mm to 4 mm, particularly preferably 0.7 mm to 3 mm and very particularly preferably 0.7 mm to 2.5 mm. In some cases, the layer thickness is preferably from 2 mm to 7 mm, particularly preferably from 2.5 mm to 7 mm and very particularly preferably from 2.8 mm to 7 mm.

Optionally, the relief precursor can comprise further layers. For example, one or more functional layers can be located on the relief-forming layer. The functional layers can, for example, have a protective function, a mask function, a barrier function, a structuring function, an adhesion or release function or combinations thereof. Said functional layers can be removed entirely or partially in a prior step or during the processing or else be present permanently. For example, there can be a protective layer which protects the relief-forming layer against contamination and damage. This is generally removed before the introduction of the code.

By means of appropriate tests, the data which is needed for the identification and further processing of the relief precursors is ascertained and provided as an at least two-dimensional code, either in analog or digital form. This two-dimensional code, can, for example, be applied in or on the packaging of the relief precursors or the relief precursor itself, for example as a label or RFID code, or printed onto the delivery papers or other documents. This data comprises data relating to the type of relief precursor and, if appropriate, process-relevant data or regions of the same which are needed to produce a relief or a functioning printing plate. Data relating to the type of relief precursor comprises, for example, an article number, a batch number, an identification number, information relating to the thickness of the plate or a layer, information relating to the length and width of the relief precursor, plate type or any desired combinations thereof. Data relating to process parameters is, for example, exposure conditions, ablation conditions, temperature conditions, cleaning conditions, development conditions, drying conditions, storage conditions, device configurations and settings, priority in the process sequence and any desired combinations thereof. Process-relevant data can also include messages or advice to the operator and, for example, a warning, an input request, a request to check parameters or device settings or device conditions, instructions and information with respect to the next process steps or combinations thereof. Likewise, the data relating to the type and the process conditions can be combined in any desired way. Furthermore, the code can be used during incoming inspection, during dispatch, during use at the correct location in the printing machine and to identify the relief precursor.

In step c) said code is introduced into the relief-forming layer as a relief, for which purpose there are multiple possibilities. The relief can be formed as elevations on a base or as depressions in a layer. Following the production of the relief, the code is firmly and permanently anchored on the precursor and is therefore permanently available and legible for all the following steps. The relief which contains the code cannot be lost in the following steps without deliberate mechanical removal (other markings, such as identifications stuck on, can be detached, for example, in development baths). Following the production of the relief, the code is present in three-dimensional form, wherein the height of the relief, which is defined by the average spacing of the surface of the elevations from the surface of the depressions, lies in a range from 0.01 µm up to 10 mm, preferably in the range from 0.1 µm up to 10 mm, particularly preferably in the range from 1 µm to 7 mm and very particularly preferably in the range from 2 µm up to 5 mm. The code can be applied at any desired point of the relief precursor; it is preferably applied in regions which do not interfere, are cut off or are not used during the subsequent use. This is generally the case in edge regions. However, the code or the codes can also be placed at one or more arbitrary points, which is advantageous in particular when the relief is divided into multiple parts. Here, a code that is tailored for the corresponding part can be applied.

In one embodiment of the method according to the invention, the relief-forming layer is a layer that can be engraved and in step c) the two-dimensional code is introduced into the relief-forming layer as a relief by material-removing methods. A layer that can be engraved generally comprises materials which permit mechanical removal or can be broken down and/or evaporated by high-energy radiation. These can be both inorganic or organic materials or combinations thereof. Preferably, organic materials are used. In addition, the relief-forming layer can contain substances which absorb the radiation and preferably convert the same into heat. These include, for example, pigments and dyes which absorb in the corresponding wavelength range. As a rule, the electromagnetic radiation for engraving the relief will generally be radiation having a wavelength in the range from 300 nm to 20,000 nm, preferably in the range from 500 nm to 20,000 nm, particularly preferably in the range from 800 nm to 15,000 nm, very particularly preferably in the range from 800 nm to 11000 nm. In addition to solid-body lasers, gas lasers or fiber lasers can also be used. Preferably, in laser engraving, use is made of Nd:YAG lasers (1064 nm) or $CO_2$-lasers (9400 nm and 10600 nm). For the selective removal of the relief layer, one or more laser beams are controlled such that the desired printing image and the code are produced.

In this case, in addition to information relating to the type (article number, batch number, identification number, information relating to the thickness of the printing plate or a layer, information relating to the length and width, type) the code can also comprise data relating to the conditions of further process steps. Examples of further process steps are thermal re-treatment to improve the mechanical properties, a cleaning treatment for removing residues of the engraving or planarization. In the case of thermal re-treatment, the data, for example, comprises information relating to the temperature, the temperature profile and the duration of the re-treatment. In the case of cleaning the printing plate as a further process step, the data, for example, comprises information relating to the cleaning agent, to the type of cleaning, to the temperature relative to ambient conditions (pressure, atmosphere, dust class etc) and duration of the cleaning.

In a further embodiment of the method according to the invention, the relief-forming layer is a photosensitive layer, and in step c) the two-dimensional code is introduced into the relief-forming layer by means of direct image exposure and subsequent removal of either the exposed or the unexposed regions of the relief-forming layer. Photosensitive layers comprise an initiator or an initiator system, a reactive compound which is caused to react by the initiator and, if appropriate, further components such as binders, additives, coloring agents and the like. The triggered reaction leads either to solidification or a reduction in the solubility of the exposed regions of the relief-forming layer or to softening/liquefaction or an increase in the solubility of the exposed regions. The differences in solubility or solidity are used in a following development step by removing the soluble or more liquid regions to produce a three-dimensional relief. Preferably, the aim is solidification or reduction of the solubility. Polymerizing and/or cross-linking reactions such as radical reactions or condensation reactions are suitable for this purpose. Preferably, radical polymerization and cross-linking are used. These in turn can be initiated photochemically or thermally. In the case of photochemical imitation, use is made of photoinitiators which produce radicals when exposed, while in the thermal variant a thermally activated disintegration into radicals is utilized. Photoactivation is preferably used. Another possibility consists in producing acids or bases photochemically, which start cross-linking or polymerization or change the solubility. The solubility of polymers can be increased, for example, by acid- or base-catalyzed cleavage of protective groups.

The relief-forming layer contains one or more initiators or initiator systems comprising at least 2 components which, when heated and/or irradiated with the electromagnetic radiation, produce radicals which effect polymerization and/or cross-linking. Such initiators are known to those skilled in the art and, for example, are described in the following literature: Bruce M. Monroe et al., Chemical Review, 93, 435 (1993), R. S. Davidson, Journal of Photochemistry and Biology A: Chemistry, 73, 81 (1993), J. P. Faussier, Photoinitiated Polymerization-Theory and Applications: Rapra Review, Vol. 9, Report, RapraTechnology (1998), M. Tsunooka et al., 25 Prog. Polym. Sci., 21, 1 (1996), F. D. Saeva, Topics in Current Chemistry, 1 56, 59 (1990), G. G. Maslak, Topics in Current Chemistry, 168, 1 (1993), H. B. Shuster et al., JAGS, 112, 6329 (1990) and I. D. F. Eaton et al., JAGS, 102, 3298 (1980), P. Fouassier and J. F. Rabek, Radiation Curing in Polymer Science and Technology, pages 77 to 117 (1993) or K. K. Dietliker, Photoinitiators for free Radical and Cationic Polymerization, Chemistry & Technology of UV & EB Formulation for Coatings, Inks and Paints, Volume, 3, Sita Technology LTD, London 1991; or R. S. Davidson, Exploring the Science, technology and Applications of U. V. and E. B. Curing, Sita Technology LTD, London 1999. Further initiators are described in JP45-37377, JP44-86516, U.S. Pat. Nos. 3,567,453, 4,343,891, EP109772, EP109773, JP63138345, JP63142345, JP63142346, JP63143537, JP4642363, JP59152396, JP61151197, JP6341484, JP2249 and JP24705, JP626223, JPB6314340, JP1559174831, JP1304453 and JP1152109.

In general, the relief-forming layer contains the initiator or initiator system in a concentration in the range from 0.1 to 20% by weight, based on the overall formulation. Preferred initiator concentrations lie in the range from 1 to 10% by weight, particularly preferably in the range from 1 to 8% by weight, very particularly preferably in the range from 1 to 6% by weight.

In a known manner, the relief-forming layer further comprises at least one ethylenically unsaturated monomer which is compatible with the binder or binders. The ethylenically unsaturated monomer can also be mixtures of two or more different monomers. Suitable compounds have at least one olefinic double bond and are polymerizable. These will therefore be designated as monomers below. Esters or amides of acrylic acid or methacrylic acid with monofunctional or poly-functional alcohols, amines, amino alcohols or hydroxyethers and hydroxyesters, esters of fumaric or maleic acid, vinyl ethers, vinyl esters and allyl compounds have proven to be particularly advantageous.

In general, said monomers are not gaseous compounds at room temperature. Preferably, the ethylenically unsaturated monomer contains at least 2 ethylenically unsaturated groups, particularly preferably 2 to 6 ethylenically unsaturated groups, very particularly preferably 2 or more ethylenically unsaturated groups. In addition, compounds with C—C triple bonds can be used in the radiation-sensitive mixtures. The ethylenically unsaturated group is at least one acrylate group and/or a methacrylate group but styrene derivatives, acrylamides, vinyl esters and vinyl ethers can also be used. The ethylenically unsaturated monomer has a molecular weight of, in general, less than 600 g/mol, preferably less than 450 g/mol, particularly preferably less than 400 g/mol very particularly preferably less than 350 g/mol and in particular less than 300 g/mol.

In one embodiment, the ethylenically unsaturated monomer is contained in a concentration in the range from 0.5 to 60% by weight, based on the overall formulation, preferably in the range from 1 to 50% by weight, particularly preferably in the range from the 1 to 40% by weight, very particularly preferably in the range from 2 to 40% by weight.

The relief-forming layer can additionally contain binders, which can be present both as inert additives and as reactants involved in the reaction and contributing to the solidification. If the binders are involved in the reaction, they carry corresponding functional groups, such as double or triple bonds or groups having an extractable hydrogen, e.g. thiols, phenols or amines.

Elastomeric binders for producing relief-forming structures from flexographic printing elements are known to those skilled in the art. Examples which may be mentioned are styrene-diene block copolymers, natural rubber, polybutadiene, polyisoprene, styrene-butadiene rubber, nitrile butadiene rubber, butyl rubber, styrene isoprene rubber, styrene butadiene isoprene rubber, polynorbornene rubber or ethylene propylene diene rubber (EPDM). Preferably, hydrophobic binders are used. Such binders are soluble in organic solvents or mixtures thereof.

The elastomer is preferably a thermoplastic elastomer block copolymer made of alkenyl aromatics or 1,3 dienes. The block copolymers can be linear, branched or radial block copolymers. Usually, these are three-block copolymers of the A-B-A type but can also be two-block polymers of the A-B type, or those having multiple alternating elastomers and thermoplastic blocks, e.g. A-B-A-B-A. Mixtures of two or more different block copolymers can also be used. The diene units can be 1,2 or 1,4 cross-linked. Both block copolymers of the styrene-butadiene or styrene-isoprene type can be used, and also of the styrene-butadiene-isoprene type. It is also further possible to use thermoplastic elastomer block copolymers having end blocks of styrene and a statistical styrene-butadiene central block. The block copolymers can also be wholly or partly hydrated, such as in SEBS rubbers. Preferred elastomeric binders are three-block copolymers of the A-B-A type or radial block copolymers of the (AB)n type, in which A is styrene and B is a diene, and statistical copolymers and random copolymers made of styrene and a diene.

In water-developable relief precursors, water-soluble, water-swellable, water-dispersible or emulsifiable polymers are used. In addition to fully or partly hydrolyzed polyvinyl acetates, polyvinyl alcohols, polyvinyl acetals, polystyrene sulfonates, polyurethanes, polyamides (as described, for example, in EP 0 085 472 or in DE 1522444) and any desired combinations thereof can be used. Examples of such polymers are described in EP 0 079 514, EP 0 224 164 and EP 0 059 988. These polymers can be linear, branched, star-shaped or dendritic and present both as homopolymers, statistical copolymers, block copolymers or alternating copolymers. Very often, the aforementioned polymers are provided with functional groups, which either increase the solubility and/or can participate in cross-linking reactions. These groups include, for example, carboxy, $SO_3$, OH, thiol, ethylenically unsaturated (meth)acrylate, epoxy groups and any desired combinations thereof.

In thermally cross-linking relief precursors, other polymers and compositions can also be used which, for example, solidify, cross-link or polymerize by radical reactions, condensation reactions or cationic or anionic addition reactions. In the condensation reactions, in particular esterification and urethane formation are applied. Epoxides can be used, for example, as cationically polymerizing or cross-linking materials, which can be activated photochemically or thermally. Such reactions can additionally be accelerated or started by means of catalysts which are known to those skilled in the art.

The total quantity of binders in the case of the relief-forming layer is usually 30 to 90% by weight with respect to the sum of all the constituents of the relief-forming layer, preferably 40 to 85% by weight and particularly preferably 45 to 85% by weight.

The relief-forming layer can contain further constituents, selected from the group comprising plasticizers, solvents, further binders, coloring agents, stabilizers, controllers, UV absorbers, dispersion aids, cross-linkers, viscosity modifiers, softeners. dyes, pigments, additives, surface-active substances and any desired combinations thereof. Said additives or aids and additional substances are contained in the radiation-sensitive mixture in an overall concentration in the range from 0.001 to 60% by weight, based on the overall formulation, preferably in the range from 0.01 to 50% by weight, particularly in the range from 0.1 to 50% by weight, very particularly in the range from 1 to 50% by weight. The individual additives are contained in concentrations of 0.001 to 40% by weight, based on the overall formulation, preferably in the range from 0.01 to 40% by weight, particularly in the range from 0.1 to 40% by weight, very particularly in the range from 0.1 to 35% by weight.

The relief-forming layer can moreover contain further functional additives, for example as described in U.S. Pat. No. 8,808,968, small quantities of phosphites, phosphines, thioethers and amino-functional compounds.

Furthermore, the relief-forming layer can contain surface active substances such as hydrophobic waxes or siliconized or perfluorinated compounds, as described in U.S. Pat. No. 8,114,566.

Furthermore, in the radiation-sensitive mixture of the relief-forming layer, inhibitors against thermal polymerization, which have no noticeable natural absorption in the actinic region in which the photoinitiator absorbs, can be contained, such as 2,6-di-tert.-butyl-p-cresol, hydroquinone, p-methoxyphenol, β-naphthol, phenothiazine, pyridine, nitrobenzene, m-dinitrobenzene or chloraniline; thiazine dyes such as thionine blue G (C.I. 52025), methylene blue B (C.I. 52015) or toluidine blue (C.I. 52040); or n-nitrosamines, such as n-nitrosodiphenylamine, or the salts, for example the potassium, calcium or aluminum salts of the n-nitrosocyclohexylhydroxylamine. Furthermore, other inhibitors or stabilizers can also be used, as described, for example, in A. Valet, Lichtschutzmittel für Lacke [Light protection agents for paints], 33ff, Vincentz Verlag Hannover 1996, and particularly sterically inhibited phenols and amines.

In addition, suitable coloring agents, such as dyes, pigments or photochromic additives, can be contained in the radiation-sensitive mixture of the relief-forming layer in a quantity of 0.0001 to 2% by weight, based on the mixture.

UV absorbers in the relief-forming layer likewise have advantages and have a positive influence on the relief formation. Compounds suitable as UV absorbers are, for example, described in A. Valet, Lichtschutzmittel für Lacke [Light protection agents for paints], 20ff, Vincentz Verlag Hannover 1996. Examples are hydroxyphenyl-benzotriazoles, hydroxybenzophenones, hydroxyphenyl-s-triazines, oxalanilides, hydroxyphenylpyrimidines, salicylic acid derivatives and cyanoacrylates and any desired combinations thereof.

The direct image exposure can be achieved in that the regions to be cross-linked are exposed selectively. This can be achieved, for example, with one or more laser beams which are controlled appropriately, by the use of monitors in which specific image points which emit radiation are activated, by using movable LED strips, by means of LED arrays, in which individual LEDs are switched on and off specifically, by means of the use of electronically controllable masks, in which image points which allow the radiation from a radiation source to pass are switched to transparent, by means of the use of projection systems, in which by means of appropriate orientation of mirrors, image points are exposed to radiation from a radiation source, or combinations thereof. Preferably, the direct exposure is carried out by means of controlled laser beams or projection systems having mirrors. The absorption spectra of the initiators or initiator systems and the emission spectra of the radiation sources must at least partly overlap.

The absorptions of the initiators or initiator systems lie in the range from 200 nm to 2000 nm, preferably in the range from 250 nm to 1100 nm, particularly preferably in the UV range, very particularly preferably in the range from 300 nm to 450 nm.

The wavelength of the electromagnetic radiation lies in the range from 200 nm to 20,000 nm, preferably in the range from 250 nm to 1100 nm, particularly preferably in the UV range, very particularly preferably in the range from 300 nm to 450 nm. Besides broadband irradiation of the electromagnetic radiation, it can be advantageous to use narrow-band or monochromatic wavelength ranges, such as can be produced by using appropriate filters, lasers or light emitting diodes (LEDs). In these cases, wavelengths of 350 nm, 365 nm, 385 nm, 395 nm, 400 nm, 405 nm, 532 nm, 830 nm, 1064 nm (and about 5 nm to 10 nm below and/or above this), on their own or in combination, are preferred.

The removal of exposed or unexposed regions of the relief-forming layer can be carried out both mechanically and chemically, depending on the nature of the layers, by treatment with washing agents, such as organic solvents, mixtures thereof, water, aqueous solutions or aqueous-organic solvent mixtures, which are capable of dissolving, emulsifying and/or dispersing non-cross-linked regions in the relief-forming layer.

In this development step, all methods familiar to those skilled in the art can be applied. The solvents or mixtures thereof, the aqueous solutions and also the aqueous-organic solvent mixtures can contain aids which stabilize the formulation and/or increase the solubility of the components of the non-cross-linked regions. Examples of such aids are emulsifiers, surfactants, salts, acids, bases, stabilizers, corrosion protection agents and suitable combinations thereof. All methods known to those skilled in the art can be used for development with these solutions, such as immersion, washing or spraying with the development medium, brushing in the presence of development medium and suitable combinations thereof. Development is preferably carried out with neutral aqueous solutions or water, the removal being assisted by means of rotating brushes or a plush. A further possible way of influencing the development consists in controlling the temperature of the development medium and, for example, accelerating the development by increasing the temperature. In this step, further layers which are still present on the radiation-sensitive layer can also be removed if these layers can be dissolved during the development and dissolved and/or dispersed adequately in the developer medium.

When organic solvents are used, use is preferably made of those which have a high flash point, which is above a temperature of 40° C., particularly preferably above 60° C. In specific cases, the flash point can also lie above 100° C.

Common washing agents are described, for example, in EP 332 070. In general, these contain aliphatic, cycloaliphatic or aromatic hydrocarbons and one or more alcohols. Most of the washing agents used on the market contain non-polar hydrocarbons as the main component and alcohols of medium polarity in a quantity of 10 to 30% by weight. In some cases, terpenes and further components are additionally used, as described, for example, in US 2016/0054656.

In the aqueous washing agents, in addition to mains water, aqueous solutions which contain further constituents, such as dispersants, emulsifiers, acids, bases, flocking agents, salts, and normally have a pH>7 are used. Used as dispersants and/or emulsifiers are cationic, anionic or non-ionic substances or combinations thereof. Examples of anionic compounds are carboxylates such as sodium laurate or sodium oleate, sulfuric acid esters such as sodium lauryl sulfate, sodium cetyl sulfate, sodium oleyl sulfate, alkyl sulfonate, phosphoric acid ester or block copolymers having polar and nonpolar blocks.

Sulfuric acid, nitric acid, phosphoric acid, formic acid, acetic acid, carbonic acid, oxalic acid, citric acid, maleic acid or p-toluenesulfonic acid, for example, can be used as organic and inorganic acids. Examples of bases are alkali and alkaline earth hydroxides, such as LiOH, KOH, NaOH or CaOH.

Use is often made of water-solvent mixtures, which permit the use of polymers of which the solubility in water is lower. Examples of solvents are methanol, ethanol, isopropanol, benzyl alcohol, cyclohexanol, cellosolve, glycerine, polyethylene glycol, dimethylformamide, dimethylacetamide and acetone.

In a further embodiment, the removal of the relief-forming layer is carried out thermally, that is to say by introducing heat and removing the softened or partly liquefied material of the layers. The heating of the exposed relief precursor can be carried out with all methods known to those skilled in the art, such as by irradiation with IR light, application of hot gases (e.g. air), by means of hot rollers or any desired combinations thereof. To remove the (viscous) liquid regions, all processes and methods familiar to those skilled in the art can be used, such as blowing off, sucking off, dabbing off, jetting off (with particles and/or droplets), stripping off, wiping off, transferring to a development medium and any desired combinations thereof. Preferably, the liquid material is picked up by a development medium (absorbed and/or adsorbed), which is continuously brought into contact with the heated surface of the relief precursor. The process is repeated until the desired relief height has been achieved. The development medium used can be papers, fabrics, nonwovens and films which can pick up the liquefied material and can consist of natural and/or synthetic fibers. Preferably, nonwovens or non-woven fiber webs made of polymers such as celluloses, cotton, polyesters, polyamides, polyurethanes and any desired combinations thereof which are stable at the temperatures which are used during the development can be used.

Optionally, following the preceding steps, further treatment steps can be carried out. These include, for example, a thermal treatment, drying, treatment with electromagnetic radiation, with plasma, with gases or with liquids, application of identification features, cutting to size, coating and any desired combinations thereof. A thermal treatment, for example, can be used to start and/or to complete reactions, to increase the mechanical and/or thermal resistance of the relief structure and to remove volatile components. For the thermal treatment, the known methods can be used, such as heating by heated gases or liquids, IR radiation and any desired combinations thereof. Ovens, blowers, lamps and any desired combinations thereof and can be used. With the treatment with gases, plasma and/or liquids, in addition to adhesive removal, surface modifications can also be effected, in particular when still reactive substances are additionally used.

Treatment with electromagnetic radiation can be used, for example, to free the surfaces of the relief structure of adhesive, to trigger and/or to complete the polymerization and/or cross-linking reactions. The wavelength of electromagnetic waves used for the irradiation lies in the range from 200 nm to 2000 nm, as already described above.

In addition to information relating to the type (article number, batch number and identification number, information relating to the thickness of the plate or a layer, information relating to length and width, type) the code can comprise data relating to the conditions of further process steps. Examples of further process steps are thermal re-treatment for drying, re-exposure for complete cross-linking and/or removing adhesive from the surface, re-treatment with liquids or combinations thereof. In the case of thermal re-treatment, the data can, for example, comprise information relating to the temperature, the temperature profile and the duration. In the case of re-exposure, the data can, for example, comprise information relating to the lamp type, to the wavelength, to the temperature and to the duration.

In a further embodiment of the method according to the invention, the relief-forming layer is a photopolymerizable layer, to which a mask layer that can be imaged is applied, wherein step c) comprises the following steps:

ca) imaging the mask layer that can be imaged, the two-dimensional code being written into the mask layer, cb) exposing the photopolymerizable relief layer with electromagnetic radiation through the formed mask;

cc) removing the remainder of the mask that can be imaged and the unexposed, non-photopolymerizable parts of the photopolymerizable relief layer.

In this embodiment, the relief-forming layer is imaged in step ca) via an indirect method and, to this end, a mask layer is imaged, wherein the image information is introduced into the mask layer in the form of transparent and non-transparent regions. The relief precursor is then exposed through the mask, radiation passing through the transparent regions into the relief-forming layer and starting a chemical reaction.

The mask layer can be a separate layer, which is applied to the relief precursor following the removal of a protective layer that may possibly be present, or an integral layer of the precursor, which is in contact with the relief layer or one of the optional layers above the relief layer, and is covered by a protective layer that may possibly be present.

The mask layer can also be a commercially available negative which, for example, can be produced by means of photographic methods based on silver halide chemistry. The mask layer can be a composite layer material in which, by means of image-based exposure, transparent layers are produced in an otherwise non-transparent layer, as described, for example in EP 3 139 210 A1, EP 1 735 664 B1, EP 2987 030, A1 EP 2 313 270 B1. This can be carried out by ablation of a non-transparent layer on a transparent carrier layer, as described, for example, in U.S. Pat. No. 6,916,596, EP 816 920 B1, or by selective application of a non-transparent layer to a transparent carrier layer, as described in EP 992 846 B1, or written directly onto the relief-forming layer, such as, for example, by printing with a non-transparent ink by means of ink-jet, as described, for example, in EP 1 195 645 A1.

Preferably, the mask layer is an integral layer of the relief precursor and is located in direct contact with the relief-forming layer or a functional layer which is arranged on the relief-forming layer, which is preferably a barrier layer. Furthermore, the integral mask layer can be imaged by ablation and in addition removed with solvents or by heating and adsorbing/absorbing. This layer is heated and liquefied by means of selective irradiation by means of high-energy electromagnetic radiation, which produces an image-based structured mask, which is used to transfer the structure to the relief precursor. For this purpose, it must be opaque in the UV range and absorb radiation in the visible IR range, which leads to the heating of the layer and the ablation thereof. Following the ablation, the mask layer also represents a relief, even if with lower relief heights in the range from 0.1 to 5 μm.

The optical density of the mask layer in the UV range from 330 to 420 nm and/or in the visible IR range from 340 to 660 nm lies in the range from 1 to 5, preferably in the range from 1.5 to 4, particularly preferably in the range from 2 to 4.

The layer thickness of the laser-ablatable mask layer is generally 0.1 to 5 μm. Preferably, the layer thickness is 0.3 to 4 μm, particularly preferably 1 μm to 3 μm. The laser sensitivity of the mask layer (measured as the energy which is needed to ablate a 1 cm$^2$ layer) should lie between 0.1 and 10 mJ/cm$^2$, preferably between 0.3 and 5 mJ/cm$^2$, particularly preferably between 0.5 and 5 mJ/cm$^2$.

For the ablation of the mask layer, it is possible to use the same light sources and wavelengths as described above in connection with laser engraving.

In step cb) the relief-forming layer is exposed through the applied and imaged mask; in general sources which permit flat irradiation being used for the exposure. This can be done by using optical devices, for example for beam widening, by a two-dimensional arrangement of multiple point-like or linear sources (for example light guides, emitters), such as fluorescent strip lamps arranged beside one another, by moving a linear source or an elongated arrangement of LEDs (array) relative to the relief precursor, for example by a uniform movement of LEDs or combinations thereof. Preferably, fluorescent strip lamps arranged beside one another or a relative movement between one or more LED strips and the relief precursor is used.

The irradiation can be carried out continuously, in a pulsed manner or in multiple short periods with continuous radiation. The intensity of the radiation can be varied over a wide range, wherein it must be ensured that use is made of a dose which is sufficient to cross-link the relief-forming layer adequately for the subsequent development operation. The radiation-induced reaction must have progressed, if appropriate after further thermal treatments, to such an extent that the exposed regions become at least partly insoluble and thus cannot be removed in the development step. Intensity and dose of the radiation depend on the reactivity of the formulation and the duration and efficiency of the development. The intensity of the radiation lies in the range from 1 to 15,000 mW/cm$^2$, preferably in the range from 5 to 5000 mW/cm$^2$, particularly preferably in the range from 10 to 1000 mW/cm$^2$. The radiation dose lies in the range from 0.3 to 6000 J/cm$^2$, preferably in the range from 3 to 100 J/cm$^2$, particularly preferably in the range from 6 to 20 J/cm$^2$. The action of the radiation can also be carried out in an inert atmosphere, for example in noble gases, $CO_2$ and/or nitrogen or under a liquid which does not damage the multilayer element.

The wavelength of the electromagnetic radiation lies in the range from 200 to 2000 nm, preferably in the range from 250 to 1100 nm, particularly preferably in the UV range, very particularly preferably in the range from 300 to 450 nm. Apart from broadband irradiation of the electromagnetic waves, it may be advantageous to use narrow-band or monochromatic wavelength ranges, as can be generated by using appropriate filters, lasers or light emitting diodes (LEDs). In these cases, wavelengths of 350 nm, 365 nm, 385 nm, 395 nm, 400 nm, 405 nm, 532 nm, 830 nm, 1064 nm (and about 5 nm to 10 nm above and below this), individually or in combination, are preferred.

In step cc) both the masks that can be imaged and the non-exposed, non-photopolymerized parts of the photopolymerizable relief-forming layer are removed, wherein the development methods described above in connection with the direct exposure can be used. It may be that the mask layer and the non-exposed parts of the relief-forming layer are removed with different methods, so that combinations of the aforementioned methods are used. For example, the mask layer can be developed by means of aqueous solutions and the relief-forming layer with organic solutions or vice versa. It is also possible to use a combination of thermal development with development by means of liquid. Preferably, one development method which removes all the layers with the same method is selected.

In specific embodiments of the method according to the invention, the at least one two-dimensional code is a bar code, a data matrix code, a QR code or a dot code. Further suitable codes are, for example, MicroQR, DataMatrix (ECC200), GS1 DataMatrix, PDF417, MicroPDF417, GS1 Composite (CC-A/CC-B/CC-C), CODE39, ITF, 2 of 5 (Industrial 2 of 5), COOP 2 of 5, NW-7 (Codabar), CODE128, GS1-128, GS1 DataBar, CODE93, JAN/EAN/UPC, Trioptic CODE39, CODE39 Full ASCII or Pharma codes. These codes, their production and the transfer back into data are sufficiently well known to those skilled in the art. Furthermore, it is also possible to use combinations of these codes in order to provide different data types in different codes, for example to provide data relating to the type of the relief precursor as a bar code and the data relating to process control as a data matrix code.

In a further specific embodiment of the method according to the invention, two or more different codes are used for different process steps. A device can read only the code which contains data relating to the corresponding process step. As a result, the amount of data to be read in the individual process steps can be limited.

The subject of the present invention is also a method for producing a relief, in particular a printing plate, starting from a relief precursor, in particular a printing plate precursor, comprising at least one carrier, a relief-forming layer and a mask layer, having the method steps:

(A) providing the relief precursor;
(B) providing data which identifies the type of relief precursor and/or contains process parameters for its processing;
(C) imaging the mask layer, by which means a mask is formed;

(D) exposing the imaged relief precursor with electromagnetic radiation through the formed mask;
(E) removing the remainder of the mask layer that can be imaged and exposed or non-exposed regions of the relief-forming layer;
(F) optionally re-treating the relief obtained;
(G) optionally exposing the rear side of the relief precursor or the relief with electromagnetic radiation, optionally between the steps (B) and (C), (C) and (D) or (D) and (E);

characterized in that the data which identifies the type of the relief precursor and/or contains process parameters for its processing, in step (C) is written into the mask layer in the form of a two-dimensional code, and after step (C) the data contained in the code is read in order to control one or more of steps (D), (E), (F) and (G). Step (G) can optionally be carried out between steps (B) and (C), (C) and (D) or (D) and (E) and ensures grounding of the relief on the carrier.

In this method, the data stored in the code is read before the respective individual steps and used to control the process steps. The steps (A) to (E) are carried out as described above for steps a), b), ca), cb) and cc). Step (F) is optional and depends on the nature of the relief precursor. These include, for example, thermal treatment, drying, treatment with electromagnetic radiation, with plasma, with gases or with liquids, application of identification features, cutting to size, coating and any desired combinations of said steps.

In relief precursors which are developed with liquids, thermal re-treatment will preferably take place, in order to remove residues of the liquids. A thermal treatment can, for example, be used to start and/or to complete reactions, to increase the mechanical and/or thermal resistance of the relief structure and to remove volatile components. For the thermal treatment, the known methods can be used, such as heating by heated gases or liquids, IR radiation and any desired combinations thereof. Ovens, blowers, lamps and any desired combinations thereof can be used. The temperatures lie in the range from 30 to 300° C., preferably in the range from 50 to 200° C., particularly preferably in the range from 60 to 150° C.

By means of the treatment with gases, plasma and/or liquids, in addition to the removal of adhesives, surface modifications can also be effected, in particular if still reactive substances are additionally used. Treatment with electromagnetic radiation can be used, for example, to free the surface of the relief structure of adhesives and to complete the polymerization and/or cross-linking reactions. The wavelength of the electromagnetic waves used for the irradiation lies in the range from 200 nm to 2000 nm when using the above-described radiation sources.

The optional step (G) requires carrier materials which are at least partly transparent to electromagnetic radiation. Preferably, this rear-side exposure is carried out through transparent, dimensionally stable materials such as polymer films and in particular polyester films as carrier material. This exposure can ensure improved adhesion of the relief layer to the carrier and, in conjunction with the front-side exposure, used to adjust the relief height. In the process, what is known as a floor or base is formed, on which the relief elevations are firmly anchored. For the performance, all radiation sources, wavelengths and methods described above can be used. The rear-side exposure can be carried out without or with a further mask layer, wherein the arrangement and structure of said mask layer are normally configured such that it is transparent in those regions in which relief elevations are formed.

In individual embodiments of the method according to the invention, the data contained in the code controls one or more of the steps (D), (E), (F) and (G) with regard to one or more of the following process parameters:
(i) intensity and/or duration of the exposure in step (D);
(ii) wavelength or wavelength range in step (D);
(iii) development temperature and/or development time in step (E);
(iv) temperature and/or treatment time in step (F);
(v) intensity and/or exposure time in step (G);
(vi) wavelength of the electromagnetic radiation in step (G);
(vii) transport speed of the relief precursor or the relief as it passes through one or more of method steps (D) to (G).

The data contained in the code controls the individual process steps which are carried out to produce the relief, and contain in particular the parameters important for the individual process steps. In step (D), these are primarily the intensity and/or the duration of the exposure with electromagnetic radiation or the radiation dose which results from the intensity and duration. The intensities and doses move in the above-described ranges. For the case in which different radiation sources or radiation sources with controllable wavelength range are used, this is also contained in the data. For the case in which the wavelength ranges can be assigned to specific radiation sources, the specification of the radiation source is possible. In movable radiation sources, the speed of movement, the direction of movement, the repetition frequency during multiple exposure, the distance from the precursor surface, the irradiation angle of the radiation, the temperature and the control thereof, or combinations of these parameters, can additionally be contained in the data.

For step (E), in particular the development temperature and the duration are important and contained in the data. Furthermore, further data can also be contained, such as the type of liquid to be used, flow rates, the rotational speed of brushes, contact pressure of the brushes and spacing of the brushes which are possibly used, sensor data for monitoring the quality of the liquids (such as viscosity, solids content, composition, temperature, pressure, density, thermal conductivity, surface tension, compressibility, etc) and combinations thereof. In the case of thermal development, in addition to the temperature, the data can contain different device components or device segments, for example, the transport speed of the relief precursor, the speed of the development medium, the number of cycles, the contact pressure of the rolls, the type and nature of the development medium, contact pressure distribution and combinations thereof.

For the re-treatment in step (F), the code can contain very different data, which depends on the type of re-treatment. In general, the duration of the re-treatment is contained in the data. In the case of thermal re-treatment, its temperature can be contained in the data. In the case of drying, in addition to the temperature of the drying, its profile and distribution and the duration of the drying, gas throughput, gas pressure, volume flow, gas velocity, mass flow or combinations thereof can be contained in the data. In the case of re-exposure, wavelength range, intensity and/or duration of the exposure with electromagnetic radiation or the radiation dose can be contained in the data. In the case of treatment with liquids, gases or plasma, these can specify the gas used, the liquid, the composition, temperature, flow rates, pressures, volume flow, mass flow, thermal conductivity, compressibility or combinations thereof. In the case of cutting the relief to size, for example, variables such as length, width, diameter, positions, contours and cutting direction can be contained in the data.

In step (G), this is primarily the intensity and/or the duration of the exposure with electromagnetic radiation or the radiation dose which results from the intensity and duration. The intensities and doses move in the ranges described above. For the case in which different radiation sources or radiation sources with controllable wavelength range are used, this is also contained in the data. For the case in which the wavelength ranges can be assigned to specific radiation sources, the specification of the radiation source is possible. In the case of movable radiation sources, the speed of movement the direction of movement, the repetition frequency, the distance from the precursor surface, the irradiation angle of the radiation, the temperature and the control thereof, or combinations thereof can be contained in the data.

In some processes, the precursor or the relief is moved at a specific speed and this transport speed can be contained in the data for individual process steps. Said transport speed can be the same or different in all the processes. In devices in which all the process steps are carried out and proceed continuously, a uniform transport speed is advantageous. Speed-determining, slow processes can, however, also be carried out with a deviating speed, in particular at the start or at the end of a process chain. If the process steps are processed in separate devices, the speeds are preferably different. The transport speed moves in the range from 10 to 2000 mm/min, preferably in the range from 20 to 1500 mm/min, particularly preferably in the range from 50 to 1000 mm/min and very particularly preferably in the range from 100 to 1000 mm/min.

The subject of the invention is also a method for producing a relief, in particular a printing plate, starting from a relief precursor, in particular a relief precursor comprising at least one carrier and a photosensitive relief-forming layer, having the method steps:
(A) providing the relief precursor;
(B) providing data which identifies the type of relief precursor and/or contains process parameters for its processing;
(C) directly exposing the relief precursor in accordance with an image;
(D) removing the exposed or non-exposed regions of the relief-forming layer;
(E) optionally re-treating the printing plate obtained;
(F) optionally exposing the rear side of the relief precursor or the relief with electromagnetic radiation, optionally between steps (B) and (C) or (C) and (D);
characterized in that the data which identifies the type of relief precursor and/or defines process parameters for its processing in step (C) is written into the relief-forming layer in the form of a two-dimensional code by means of direct exposure, and after step (C) the data contained in the code is read in order to control one or more of steps (D), (E) and (F). Step (G) can optionally be carried out between the steps (B) and (C) or (C) and (D) and ensures grounding of the relief on the carrier. This method differs from the method described above only in the fact that no mask is produced, instead the image exposure takes place directly. Therefore, the above statements and descriptions apply to all further steps and the data controlling said steps.

In specific embodiments, is of this method, the data contained in the code controls one or more of the steps (D), (E) and (F) with regard to one or more of the following process parameters:

(i) development temperature and/or development time in step (D);
(ii) temperature and/or development time in step (E);
(iii) intensity and/or exposure time in step (F);
(iv) wavelength of the electromagnetic radiation in step (F);
(v) transport speed of the relief precursor or the relief as it passes through one or more of method steps (D) to (F).

The subject of the invention is also a method for producing reliefs starting from a relief precursor comprising at least one carrier and a relief-forming layer that can be engraved, having the method steps:
(A) providing the relief precursor;
(B) providing data which identifies the type of relief precursor and/or contains process parameters for its processing;
(C) optionally exposing or thermally treating the whole area of the relief precursor;
(D) writing a three-dimensional relief into the relief-forming layer by material-removing methods;
(E) optionally removing residues from the relief surface;
(F) optionally re-treating the relief obtained;
(G) optionally re-exposing the relief obtained with electromagnetic radiation;
characterized in that the data which identifies the type of relief precursor and/or contains process parameters for its processing in step (D) is written into the relief-forming layer in the form of a two-dimensional code by laser engraving, and after step (D) the data contained in the code is read in order to control one or more of steps (E), (F) and (G). This method differs from the preceding methods in the fact that the relief production is carried out by means of a material-removing method, and exposure through a mask and removal of exposed or non-exposed regions is dispensed with. Further steps can be carried out as described above, and the data controlling said steps can be procured as described above.

In step (D), it is possible to use all methods which remove material, for example mechanical engraving, ablation or engraving with the aid of high-energy radiation. Preferably, what is known as laser engraving is used, in which a high-energy laser beam is guided over the precursor in order to produce the image-based structure and the code. The material to be removed is intensively heated, broken down and removed. The electromagnetic radiation used for the engraving will as a rule be radiation having a wavelength in the range from 300 to 20 000 nm, preferably in the range from 500 to 20 000 nm, particularly preferably in the range from 800 to 15 000 nm, very particularly preferably in the range from 800 to 11,000 nm. Preferably, a $CO_2$ laser is used in laser engraving. For the selective removal of the relief layer, one or more laser beams is or are controlled such that the desired image and the code are produced. The energies of the laser beam that are used lie in the range from 10 to 1000 W, preferably in the range from 20 to 1500 W, particularly preferably in the range from 50 to 1000 W.

The removal of residues in step (E) can be carried out by mechanical removal, rinsing off with liquid, sucking off, blowing off, brushing off or combinations thereof. Step (E) can also take place during step (D), in particular when the residues are sucked off and/or blown off. During the use of liquids, care must be taken that these do not change the relief structure, in particular by solubilization or swelling. Sucking off has the advantage that residues can be removed from the gas phase, for example by means of filters and/or separators, and thus do not reach the environment in an uncontrolled manner. For the purpose of blowing off, gases can be used which do not damage the relief structure and/or are admissible from safety aspects. Preferably, air and inert gases such as nitrogen, carbon dioxide, argon or combinations thereof are used.

In step (F), it is possible for thermal re-treatments or treatments with plasma, with gases or with liquids, application of identification features, cutting to size, coating and any desired combinations thereof to be involved.

In specific embodiments of this method, the data contained in the code controls one or more of steps (E), (F) and (G) with regard to one or more of the following process parameters:

(i) duration and/or temperature in step (E);
(ii) positive or negative pressure in step (E);
(iii) temperature and/or duration in step (F);
(iv) intensity and/or exposure time in step (G);
(v) wavelength of the electromagnetic radiation in step (G);
(vi) transport speed of the relief as it passes through one or more of method steps (E) to (G).

In all the above-described embodiments of the method according to the invention, the reading of the data can be carried out in many ways. For example, it can be carried out optically or mechanically by sensing. Preferably, the reading is effected without contact. The reading can be carried out automatically, by the relevant device or the relevant device part detecting the code on the relief precursor. However, it can also be carried out manually by an operator, who detects the code by means of an appropriate reading device. In preferred embodiments of the method according to the invention, the data contained in the code is detected without contact.

As a non-contact method, in particular optical methods are used, such as reading with a camera and analysis of the images, with a scanner or combinations thereof. Preferably, linear, point or surface scanners are used.

In a further embodiment of the method according to the invention, the data contained in the code identifies the type of relief precursor, wherein the associated process parameters are read from a database. Data relating to the type of relief precursor comprises, for example, an article number, a batch number, an identification number, information relating to the thickness of the plate or a layer, information relating to length and width, type, or any desired combinations thereof. By using said data, a device can read the process parameters belonging to this precursor from a database and use said data for the individual control of the process. The database can be stored in the device and be brought up to date in the event of changes to the data or at regular intervals. The data can also be stored in a central database or multiple databases, and the devices can make access thereto via an appropriate electronic connection.

The transmission of the data from the reading devices to the process devices can be carried out by means of usual methods. If the reading devices are integrated into the process devices, the transmission of the data by cable is preferred. If the reading devices are not integrated, the transmission can be carried out by cable and a corresponding plug-in connection, via wire-free communication such as by means of radio signals (directional radio, WPAN) or light signals (infrared signals), via electronic networks, by means of inductive effects (near field communication NFC, RFID) or combinations thereof. Radio connections are also known, for example under the terms "Bluetooth" or "WLAN" (Wireless Local Area Network). Likewise, the transmission via cable-bound connections such as LAN or by using cable-bound protocols is possible. The data can be stored and transmitted in all conventional formats. This is preferably done by means of so-called CSV files (comma separated values), SDF (simple data format), text files, PTC files, ASCII files and/or JSON (Java Script Object Notation). The following communication protocols can be used for the transmission, e.g. EtherNet/IP, PROFINET, SPS Link, TCP/IP, FTP, MC-Protokoll, Omron PLC link, KV STUDIO or combinations thereof. The following interfaces can be used for the transmission: USB, RS-232C, wire-free and wire-bound transmission, Ethernet, WLAN, RFID, GSM/UMTS/LTE, ProfiBus, Modbus, FoundationFieldbus, serial interfaces or combinations thereof.

The subject of the invention is also the relief structure with the code, produced according to the methods described above. The relief structures produced in this way can be used as printing plates, in particular as flexographic printing plates, book printing plates, pad printing plates and gravure printing plates. Likewise, the relief structures can be used as optical components, for example as a Fresnel lens.

If at least one further layer which is so rigid that it does not follow the shape of the relief is applied to the relief structures produced, components are produced with channels and/or voids which can be separated from one another or connected to one another. To this end, the further layer can be stiff or inflexible, so that it does not sink into the depressions; but it is also possible to use flexible layers if, by means of suitable measures, it is ensured that the further layer cannot sink into the depressions (for example in that the depressions are filled with liquids and/or gases and subsequently removed). These channels and/or voids can optionally be provided with other materials and/or liquids. Components of this type can be used as a microfluidic component (e.g. for microanalysis and/or for high-throughput screening), as a micro-reactor, optical component, for example as a phoretic cell (as illustrated, for example, in WO2004/015491) as a light-controlling element for color display (as described, for example, in WO2003/062900) or as photonic crystals. The further layer can, for example, be applied within the scope of the re-treatment according to step viii). The aforementioned components can be designed to be both stiff and/or flexible. Flexible embodiments are preferred in particular when they are to be worn on and/or in the body and/or are to be used in fabrics and/or in items of clothing.

The subject of the invention is thus also the use of the relief produced according to the invention as a pad printing plate, flexographic printing plate, book printing plate, gravure printing plate, microfluidic component, micro-reactor, phoretic cell, photonic crystal and optical component.

EXAMPLES

In the examples, the information transmission was carried out by means of the control software CX Server-lite Version 2.2 from OMRON ELECTRONICS GmbH. To this end, the code was detected by means of an SR-G100 Scanner (Keyence, settings), changed to a CSV file (Excel) and transferred to the PLC controller of the devices via a 2.2 interface.

Example 1

Nyloprint® WF-H 80 plates (Flint Group) with a PET carrier layer, a 50 µm thick relief layer and protective layer were exposed over the entire surface with a Nyloprint® Exposure 96×120 ED (Flint Group) for 5 min, following removal of the protective layer. The plates were then engraved with a Kronos 7612 (SPGPrints Austria GmbH) equipped with a 750 W $CO_2$ laser with a resolution of 2540 dpi. In the edge region, a code was produced as a relief with data (passage speed and drying temperature) for the subsequent cleaning and drying. The code was read with an SR-G100 Scanner (Keyence) and read into a nyloprint DWT 100. The plate was washed with water at 300 mm/min and dried at 60° C.

Example 2

Nyloflex® Sprint 114 plates (Flint Group) with a PET carrier layer, a relief layer and protective layer were exposed over the entire rear side for 30 s with a Nyloprint® Exposure 96×120 ED exposer. Following removal of the protective layer, they were exposed directly with a MultiDX! 220 (Lüscher Technologies AG), equipped with X!Direct software and with UV laser diodes, which produce light with a wavelength in the region of 405 nm, with a dose of 600 $mJ/cm^2$. In the edge region, a code was produced as a relief with data relating to passage speed (170 mm/m), drying temperature (60° C.) and re-exposure with UVA. The plates were developed in a nyloprint flowline washer DWT 100 at a passage speed of 170 mm/min and by using water and dried at 60° C. and re-exposed for 2 min with UVA light, according to the data read in.

Example 3

Nyloflex® FAC 284 plates (Flint Group) with a PET carrier layer, a relief layer and protective layer were exposed over the entire rear side with a nyloflex Exposure FV exposer (Flint Group). To control the exposer, by means of an SR-G100 scanner (Keyence) a data matrix code which comprised the exposure conditions (time) was read in. Following removal of the protective layer, the plates were exposed through an LADF 0175 dry film mask (Folex) by using a nyloflex Exposure FV (Flint Group) using LED light with a wavelength of 365 nm and an intensity of 20 $mW/cm^2$ for 15 min. The mask contained a data matrix code with the additional information relating to the further process steps (main exposure 20 min, washing speed 190 mm/min, drying time 124 min at 60° C., re-exposure simultaneous UVA/UVC 12.5 min). The code was read with an SR-G100 scanner (Keyence) and read into a nyloflex Automated Plate Processor, by which means the plates were developed, dried and re-exposed according to the data read in.

Example 4

A Nyloflex® FAC 284 D plate (Flint Group) provided with a mask layer, a PET carrier layer, a relief layer, a mask layer and a protective layer was used as a relief precursor, and the associated process data was changed into a data matrix code.

The plates were exposed over the entire area from the rear side for 100 s with a nyloflex NExT Exposure FV exposer (Flint Group) by means of fluorescent strip lamps. Following the removal of the protective layer, the data matrix code was produced in an edge region on the precursor by laser ablation, and the imaging of the mask layer was performed. The ablation was performed with a ThermoFlexX 80 D (Xeikon, Laser output 100 W), the software Multiplate (Version 5.0.0.276) and the following parameters: wavelength 1070 nm, mode 3. The data matrix code contained information relating to plate type, plate thickness, exposure conditions and development conditions, drying temperature and drying time and re-exposure conditions. By using an SR-G100 scanner (Keyence), the code on the mask layer was read and read into the following exposer.

The UV exposure was carried out with a nyloflex NExT Exposure FV (Flint Group) using LED light with a wavelength of 365 nm and according to the S4 setting.

By using an SR-G100 scanner (Keyence), the code on the mask layer was read and read into the following developer. The development was then carried out with solvent in an FII washer (Flint Group) at 35° C. by using nylosolv A (Flint Group) as development solution with a passage speed of 60 mm/min.

By using an SR-G100-Scanner (Keyence), the code on the relief structure was read and read into the following nyloflex Dryer FV dryer. The drying was carried out over 180 min at 60° C.

By using an SR-G100-Scanner (Keyence), the code on the relief structure was read and read into the following Combi Fill exposer (Flint Group). Re-exposure was carried out simultaneously with 15 min UVA and UVC.

Example 5

Example 4 was repeated but, following the ablation of the mask layer, the data (main exposure 20 min, washing speed 190 mm/min, drying time 124 min at 60° C., simultaneous re-exposure UVA/UVC, exposure 12.5 min) was read into a nyloflex Automated Plate Processor, by which means the plates were developed, dried and re-exposed according to the data read.

Example 6

Example 4 was repeated, but use was made of a code which, besides the article number, also contained the batch number. By using this data, the device (nyloflex Automated Plate Processor) searched for the associated data from a connected database and used said data for the processing.

The invention claimed is:

1. A method for identifying a relief precursor or a relief comprising a carrier and a relief-forming layer, having the steps:
    a) providing a relief precursor comprising a carrier and a relief-forming layer, wherein the relief-forming layer is a photopolymerizable layer, to which a mask layer that can be imaged is applied;
    b) providing a desired printing image and data which identifies the type of relief precursor or relief and contains process-relevant data for processing it, in the form of at least one two-dimensional code;
    c) performing image-based structuring of the relief precursor based on the desired printing image and introducing the at least one two-dimensional code into the relief-forming layer as a relief during the image-based structuring,
    wherein step c) comprises the following steps:
    ca) writing the two-dimensional code and the desired printing image into the mask layer by imaging the mask layer,
    cb) exposing the photopolymerizable relief-forming layer with electromagnetic radiation through the imaged mask layer;
    cc) removing the remainder of the mask layer and the unexposed parts of the photopolymerizable relief-forming layer so as to obtain the relief,
    wherein after step ca) the data contained in the code is read in order to control at least one of steps cb) and cc).

2. The method as claimed in claim 1, wherein the at least one two-dimensional code comprises a data matrix code, QR code or dot code.

3. The method as claimed in claim 1, wherein the at least one two-dimensional code comprises two or more different codes for different process steps.

4. The method as claimed in claim 1, characterized in that the data contained in the code is read without contact.

5. The method as claimed in claim 1, wherein the data contained in the code identifies the type of relief precursor, and wherein the method further comprises reading associated process parameters from a database based on the read code.

6. The method as in claim 1
wherein step cb) is performed by moving a linear source or an elongated arrangement of LEDs relative to the relief precursor.

7. The method as claimed in claim 1, wherein after step ca) the data contained in the code is read in order to control at least step cb).

8. The method as claimed in claim 1, wherein after step ca) the data contained in the code is read in order to control both steps cb) and cc).

9. A method for producing a relief starting from a relief precursor comprising at least one carrier, a relief-forming layer and a mask layer, having the method steps:
  (A) providing the relief precursor;
  (B) providing data which identifies the type of relief precursor and/or contains process parameters for its processing and a desired printing image;
  (C) imaging the mask layer based on the provided data and the desired printing image, by which means a mask is formed;
  (D) exposing the imaged relief precursor with electromagnetic radiation through the formed mask;
  (E) removing the remainder of the mask layer and the unexposed regions of the relief-forming layer so as to obtain the relief;
  (F) optionally re-treating the relief obtained;
  (G) optionally exposing the rear side of the relief precursor or the relief with electromagnetic radiation in the range of 300 to 450 nm, optionally between the steps (B) and (C), (C) and (D) or (D) and (E);
wherein the data which identifies the type of the relief precursor and/or contains process parameters for its processing in step (C) is written into the mask layer in the form of a two-dimensional code, and after step (C) the data contained in the code is read in order to control at least one of steps (D), (E) and (G) if present.

10. The method as claimed in claim 9, characterized in that the data contained in the code controls at least one of the steps (D), (E) and (G) if present with regard to one or more of the following process parameters:
  (i) intensity and/or duration of the exposure in step (D);
  (ii) wavelength in step (D);
  (iii) development temperature and/or development time in step (E);
  (iv) intensity and/or exposure time in step (G);
  (v) wavelength of the electromagnetic radiation in step (G);
  (vi) transport speed of the relief precursor or the relief as it passes through one or more of method steps (D), (E) and (G).

11. A method for identifying a relief precursor or a relief comprising a carrier and a relief-forming layer, having the steps:
  a) providing a relief precursor comprising a carrier and a relief-forming layer, wherein the relief-forming layer is a photopolymerizable layer, to which a mask layer is applied, wherein the mask layer is an integral layer of the relief precursor, and wherein the optical density of the mask layer in the visible IR range from 340 to 660 nm lies in the range from 1 to 5;
  b) providing a desired printing image and data which identifies the type of relief precursor or relief and/or contains process-relevant data for processing it, in the form of at least one code;
  c) performing image-based structuring of the relief precursor based on the desired printing image and introducing the at least one code into the relief-forming layer as a relief during the image-based structuring,
wherein step c) further comprises the following step:
  ca) writing the desired printing image and the code into the mask layer by imaging the mask layer.

12. The method as claimed in claim 11, wherein step c) further comprises the following steps:
  cb) exposing the photopolymerizable relief-forming layer with electromagnetic radiation through the imaged mask layer;
  cc) removing the remainder of the mask layer and the unexposed parts of the photopolymerizable relief-forming layer, so as to obtain the relief.

13. The method as claimed in claim 11, characterized in that the at least one code is a bar code, data matrix code, QR code or dot code.

14. The method as in claim 11, wherein the layer thickness of the mask layer is 1 μm to 3 μm.

15. The method as in claim 11, wherein after step ca) the data contained in the code is read in order to control at least one of steps cb) and cc).

16. The method as claimed in claim 9, wherein after step A) the data contained in the code is read in order to control at least step (D).

17. The method as claimed in claim 16, wherein the data contained in the code controls at least the intensity and/or duration of the exposure in step (D).

* * * * *